(12) United States Patent
Morgan

(10) Patent No.: US 8,014,220 B2
(45) Date of Patent: Sep. 6, 2011

(54) CURRENT MODE DATA SENSING AND PROPAGATION USING VOLTAGE AMPLIFIER

(75) Inventor: Donald M. Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/889,104

(22) Filed: Sep. 23, 2010

(65) Prior Publication Data

US 2011/0013471 A1    Jan. 20, 2011

Related U.S. Application Data

(63) Continuation of application No. 12/107,564, filed on Apr. 22, 2008, now Pat. No. 7,813,199.

(51) Int. Cl.
*G11C 7/00* (2006.01)

(52) U.S. Cl. ............... 365/205; 365/189.16; 365/230.06

(58) Field of Classification Search .................. 365/205, 365/207, 208, 189.15, 189.16, 230.06, 230.08
See application file for complete search history.

(56) References Cited

U.S. PATENT DOCUMENTS

| | | | |
|---|---|---|---|
| 4,237,479 A | 12/1980 | Lavigne | |
| 4,949,306 A | 8/1990 | Nakagome et al. | |
| 5,677,878 A | 10/1997 | Shirley et al. | |
| 5,796,666 A | 8/1998 | Shirley et al. | |
| 5,917,380 A | 6/1999 | Darthenay et al. | |
| 5,929,482 A | 7/1999 | Kawakami et al. | |
| 5,949,730 A | 9/1999 | Shirley et al. | |
| 7,813,199 B2 * | 10/2010 | Morgan | 365/205 |
| 7,839,703 B2 * | 11/2010 | Baker | 365/189.15 |
| 2008/0310236 A1 * | 12/2008 | Baker | 365/185.21 |
| 2009/0261864 A1 | 10/2009 | Morgan | |
| 2011/0063930 A1 * | 3/2011 | Baker | 365/189.15 |

* cited by examiner

*Primary Examiner* — Gene N Auduong
(74) *Attorney, Agent, or Firm* — Schwegman, Lundberg & Woessner, P.A.

(57) ABSTRACT

A method and a circuit for current mode data sensing and propagation by using voltage amplifier are provided. Example embodiments may include providing an output signal from a voltage amplifier in response to the voltage amplifier receiving an input signal. The method may include providing a current output signal from a voltage-to-current converter in response to the voltage-to-current converter receiving the output signal. The output signal may be used to drive a current sense amplifier.

21 Claims, 10 Drawing Sheets

CURRENT MODE DATA SENSING AND PROPAGATION USING VOLTAGE AMPLIFIER

RELATED APPLICATION

This application is a continuation of U.S. application Ser. No. 12/107,564, filed Apr. 22, 2008 now U.S. Pat. No. 7,813,199, which is incorporated herein by reference in its entirety.

TECHNICAL FIELD

Example embodiments relate generally to the technical field of microelectronics and their manufacture.

BACKGROUND

The speed of Very Large Scale Integration (VLSI) chips is increasingly limited by signal delay in long interconnect lines. In particular, with the progress of Integrated Circuit (IC) technology into the very deep submicron regime, signal propagation on long interconnects is becoming a major bottleneck in the performance of large circuits. For example, in memory devices, e.g., Dynamic Random Access Memory (DRAM), Static Random Access Memory (SRAM), etc., data signals collected may be propagated from individual memory arrays to input/output (I/O) pads wherein the data may be made accessible to users.

BRIEF DESCRIPTION OF THE DRAWINGS

Some embodiments are illustrated by way of example and not limitation in the figures of the accompanying drawings in which.

DETAILED DESCRIPTION

Example methods and circuits for current mode data sensing and propagation by using voltage amplifier will be described. In the following description, for purposes of explanation, numerous examples, having example-specific details are set forth in order to provide a thorough understanding of example embodiments. It will be evident, however, to one skilled in the art that the present examples may be practiced without these example-specific details.

Some example embodiments described herein may include providing an output signal from a voltage amplifier in response to the voltage amplifier receiving an input signal. The method may include providing a current output signal from a voltage-to-current converter in response to the voltage-to-current converter receiving the output signal. The output signal may be used to drive a current sense amplifier. Current-mode signal propagation used in this application is known to make major speed improvements as compared to voltage-mode signal transport techniques. The use of low-resistance current-signal circuits may play a key role in reducing the impedance level and the voltage swings on long interconnect lines.

Figure 1:
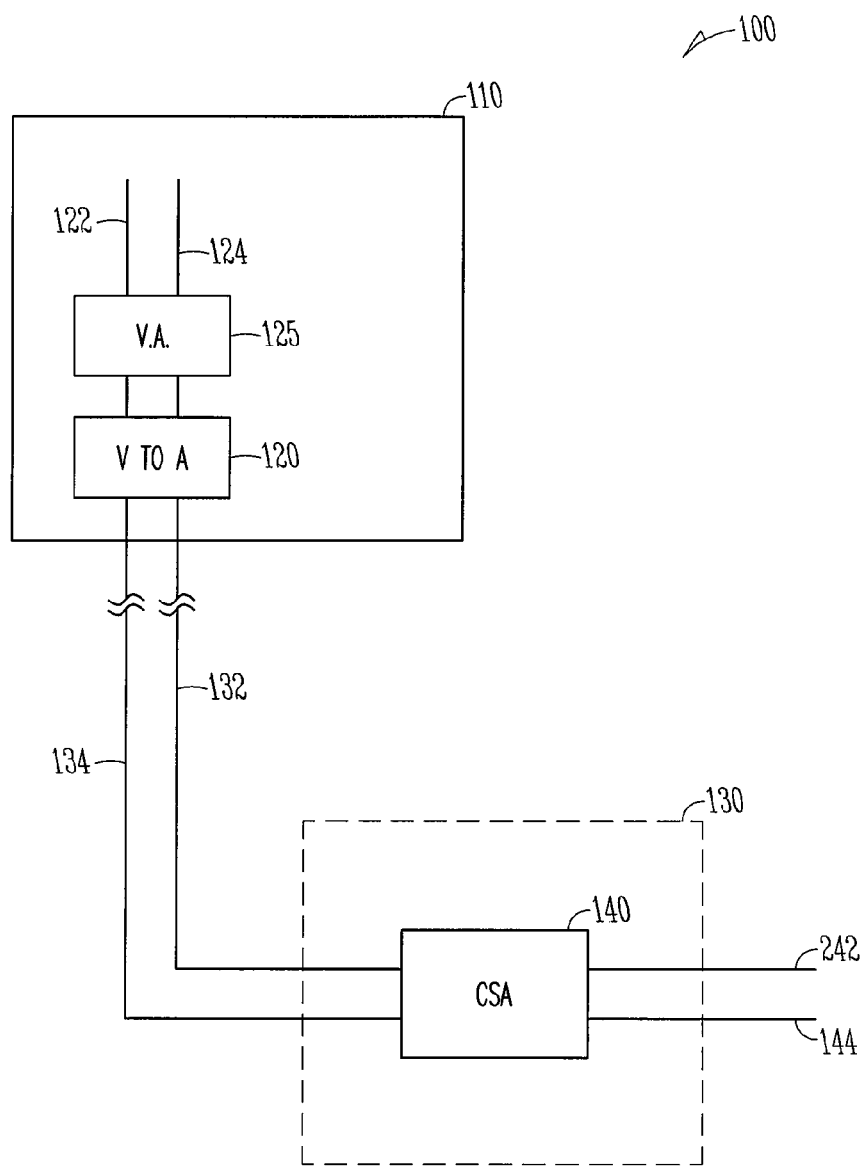
FIG. 1 is a high-level diagram illustrating an example embodiment of a device for current mode data sensing and propagation by using voltage amplifier.

FIG. 1 is a high-level diagram illustrating an example embodiment of a device 100 for current mode data sensing and propagation by voltage amplifier. The device 100 may include a memory device consisting of one or more memory arrays 110 including multiple memory cells. The data stored in these memory cells may be accessed using one or more pairs of complementary digit lines 122 and 124 using the shown arrangement of a voltage amplifier (V.A.) 125, a voltage-to-current (V to I) converter 120, and a current sense amplifier (CSA) 140. As shown in FIG. 1, the voltage amplifier 125 and the voltage-to-current converter 120 may be provided on the memory array 110 of a chip, while the current sense amplifier may be positioned in a periphery area 130 of the same chip.

According to an example embodiment, the voltage amplifier 125 may be configured to receive an input signal from the pair of complementary digit lines 122 and 124. The voltage amplifier 125 may operatively provide an output signal to the voltage-to-current converter 120. The voltage-to-current converter 120 may generate a current output signal based on the output signal received from the voltage amplifier 125. The current sense amplifier 140 may be responsive to the current output signal received from the voltage-to-current converter 120.

In example embodiments, the current output signal from the voltage-to-current converter 120 may propagate to the current sense amplifier 140 using the signal paths 132 and 134. The signal paths 132 and 134 may also be referred to as global input/output (GIO) lines of memory array 110. The output voltage of the current sense amplifier 140 may be coupled to the I/O pads of the memory device 100 through I/O lines 142 and 144.

Figure 2:
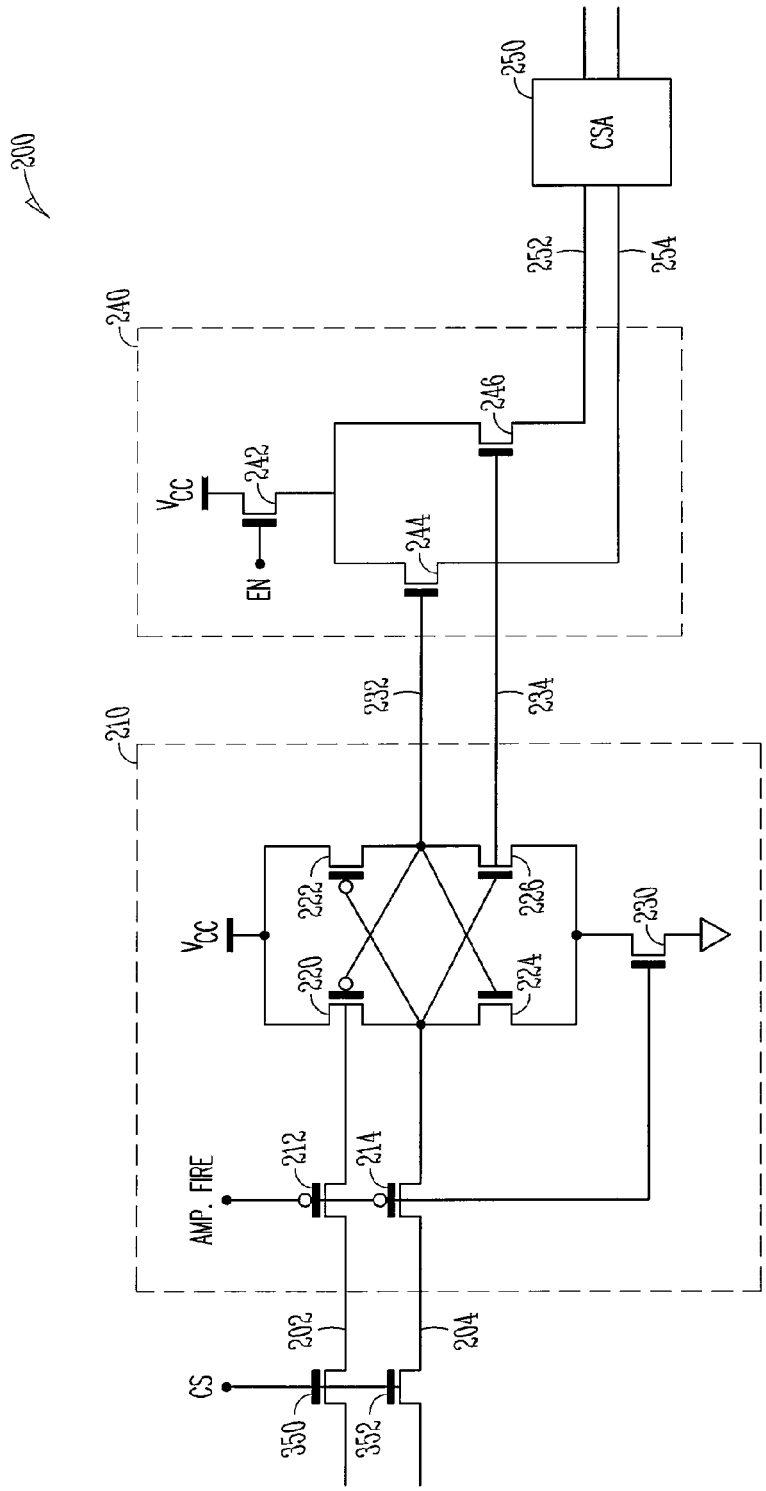
FIG. 2 illustrates an example embodiment of a latched voltage amplifier and a voltage-to-current converter driving a current sense amplifier.

FIG. 2 is illustrates an example embodiment of a flip-flop voltage amplifier 210 and a voltage-to-current converter 240 driving a current sense amplifier 250. The schematic 200 may include a cross-coupled voltage amplifier 210, a voltage-to-current converter 240, and a current sense amplifier 250. The voltage amplifier 210 may receive an input signal, which, in an example embodiment, may include a pair of complimentary input signals received from the I/O lines 202 and 204. The voltage amplifier 210 is configured to operatively provide an output signal. The voltage-to-current converter 240 may generate a current output signal, based on the output signal received from the voltage amplifier 210 through the coupling lines 232 and 234. The current sense amplifier 250 may be responsive to the current output signal received from the voltage-to-current converter 240 through the lines 252 and 254. In an example embodiment, the current sense amplifier may be a cross-coupled amplifier.

In an example embodiment, the voltage amplifier 210 may include a flip-flop amplifier 225 formed by cross-coupled P-transistors 220 and 222 and cross-coupled N-transistors 224 and 226. Gates of the P-transistor 220 and N-transistor 224 may be connected to the I/O line 202 through the control transistor 212. In addition, the gates of the P-transistor 222 and the N-transistor 226 may be coupled to the I/O line 204 through the control transistor 214. Transistors 212 and 214, when turned off, may isolate the voltage amplifier 210 from the inputs (I/O lines 202 and 204). Drains of the P-transistors 220 and 222 may be coupled to the supply voltage $V_{CC}$ and the sources of the N-transistor 224 and 226 may be connected to a ground through the coupling transistor 230. According to an example embodiment, the voltage amplifier 210 may be replaced by an operational amplifier (op-amp).

According to an example embodiment, the voltage-to-current converter 240 may include a pair of source followers formed by N-transistors 244 and 246, the drain of which may be connected to $V_{CC}$ through an enabling transistor 242. In an example embodiment, all transistors used in the flip-flop voltage amplifier 210 and the voltage-to-current converter 240 may be implemented using Complementary Metal Oxide Semiconductor (CMOS) technology.

Figure 3:
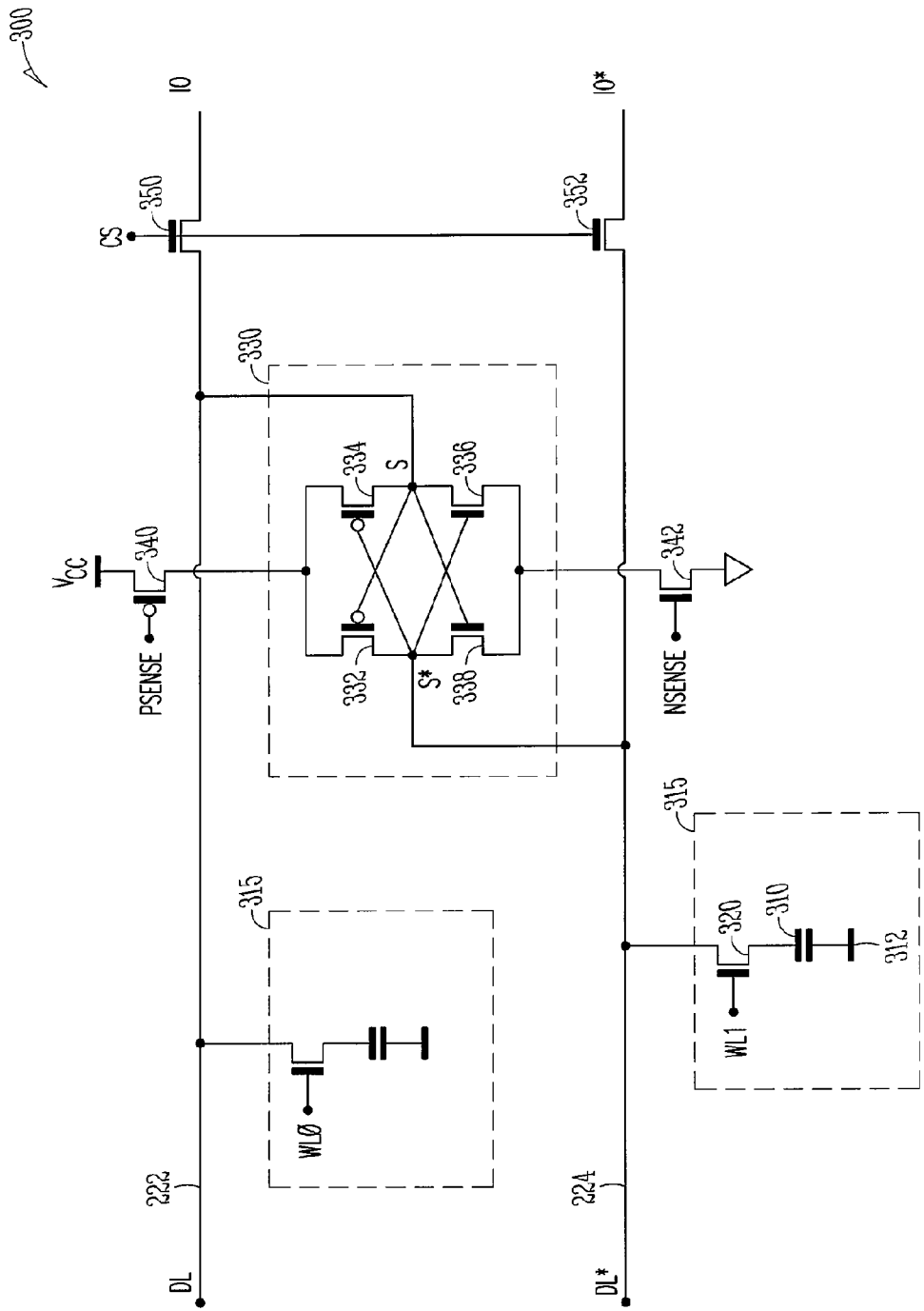
FIG. 3 illustrates an example embodiment for current mode sensing of a pair of digit lines coupled to memory cells.

FIG. 3 shows an example sense amplifier 330 coupled to memory cells 315 through complementary digit lines 122 and 124 (DL, DL*). The sense amplifier 330 and the memory cells 315 may be part of the memory array 110 of FIG. 1, which are shown here to facilitate understanding of the formation of signals across the complementary digit lines 122 and 124 (DL and DL*) and the input/output lines IO and IO*. I/O lines 202 and 204 of FIG. 2 may be coupled to the complementary digit lines DL and DL* through column select transistors 350 and 352. The signals on the complementary digit lines DL and DL* may be driven to their corresponding logic levels by the sense amplifier 330. The sense amplifier may sense the data stored on memory cells coupled to the complementary digit lines DL and DL*.

In an example embodiment, the sense amplifier 330 may be connected via the sense lines S, S* to the complimentary digit lines DL and DL*. Also shown in FIG. 3 are P-transistor 340, an N-transistor 342 (coupled to PSENSE and NSENSE lines described below, respectively), column-select (CS) line, and column select transistors 350 and 352. In operation, the complimentary digit lines DL and DL* are normally pre-charged to a level equal to one-half of the supply voltage, i.e., $V_{CC}/2$. Each of the memory cells 315 may include an access transistor 320 and a memory cell capacitor 310 coupled between the transistor 320 and cell plate 312. The cell plate 312 may be generally biased at one-half the supply voltage, i.e., $V_{CC}/2$. A gate of each access transistor 320 may be coupled to respective word lines WL0 or WL1.

The sense amplifier 330 may sense a voltage developed between the complimentary digit lines DL and DL* and then drive the complimentary digit lines to corresponding logic levels ($V_{CC}$ or ground). Sense amplifier 330 may use the cross-coupled P-transistors 332 and 334 and cross-coupled N-transistors 336 and 338 to couple the digit lines to $V_{CC}$ or the ground via P-transistor 340 and N-transistor 342, respectively. The formation of the DL and DL* signals may be demonstrated by the waveforms shown in FIG. 4. The WL signal may represent the WL1 signal applied to the gate of the access transistor 320 to enable coupling of the digit line DL* to the capacitor 310. The capacitor 310 may store a voltage equal to either $V_{CC}$ or ground. The assumption here is that the capacitor 310 was at ground level at the time that the WL signal was applied. As soon as the NSENSE and the PSENSE lines turn on the N-transistors 342 and the P-transistor 340, a separation between the DL and DL* starts to develop. The driving of the digit lines by the sense amplifier takes place by coupling the DL line to the $V_{CC}$ through ON P-transistors 334 and 340 and DL* line to the ground through the ON N-transistors 338 and 342. However, the transition of these lines may be quite slow due to the large capacitances of the digit lines DL and DL*.

Figure 4:
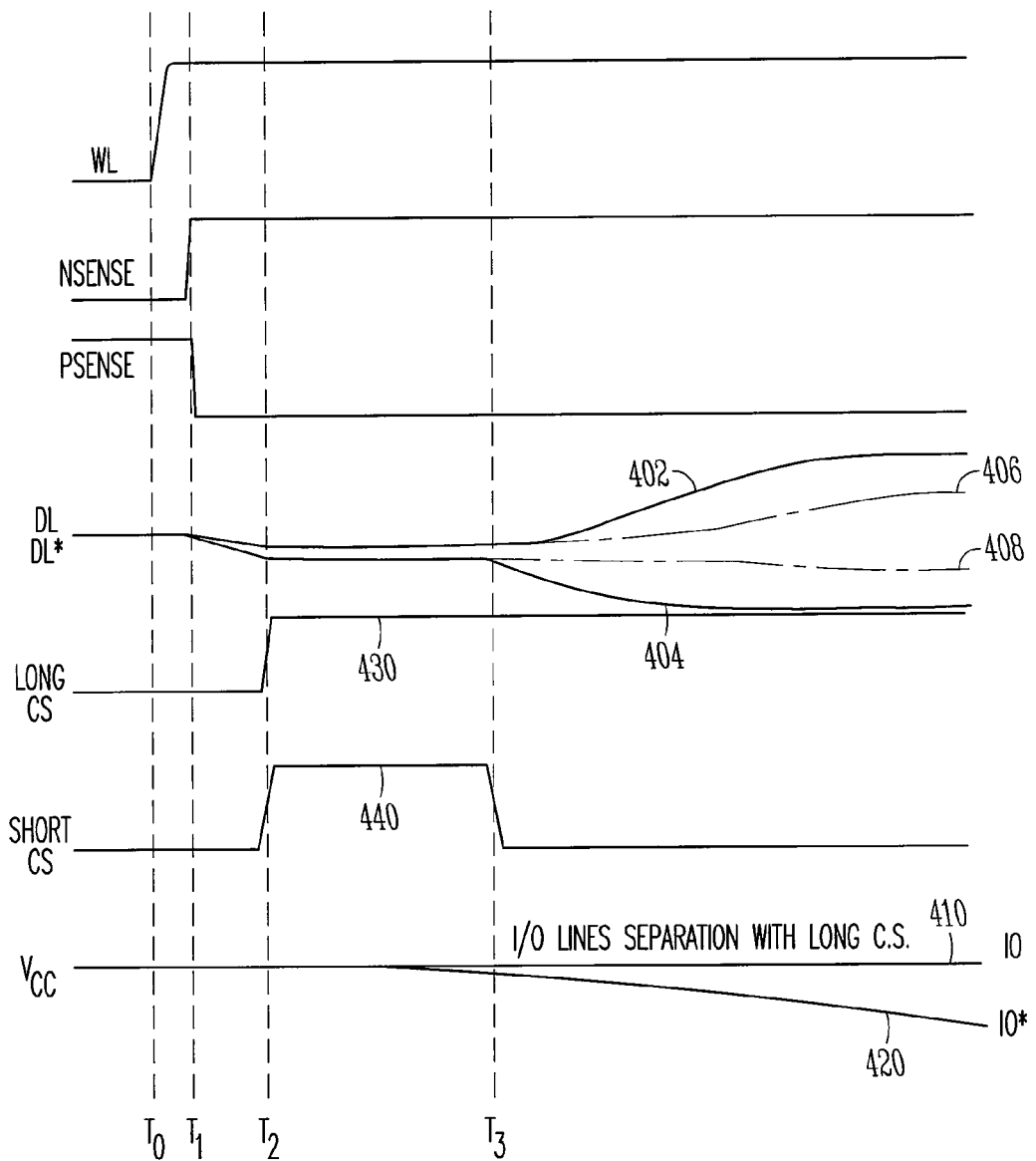
FIG. 4 illustrates waveform diagrams, in example embodiments, of various signals present in the schematic of FIG. 3.

As the CS line is driven high, the column select transistors 350 and 352 couple the I/O lines (which are pre-charged to $V_{CC}$) to the complementary digit lines DL and DL*, causing the I/O* line to be pulled towards the ground (see FIG. 4, I/O line signals 410 and 420). FIG. 4 also shows the effect of the length of the CS pulse on the separation of digit lines DL and DL*. The separation of the DL and DL* towards their corresponding levels (in this case $V_{CC}$ and ground) may be expedited by applying a short CS pulse (e.g., signal 440), as compared to a long CS pulse (e.g., signal 430). The slow transition is exacerbated in this example by the early application of the CS pulse as discussed below. The CS pulse may be applied early to accommodate an early column access such as an early read command.

Figure 5:
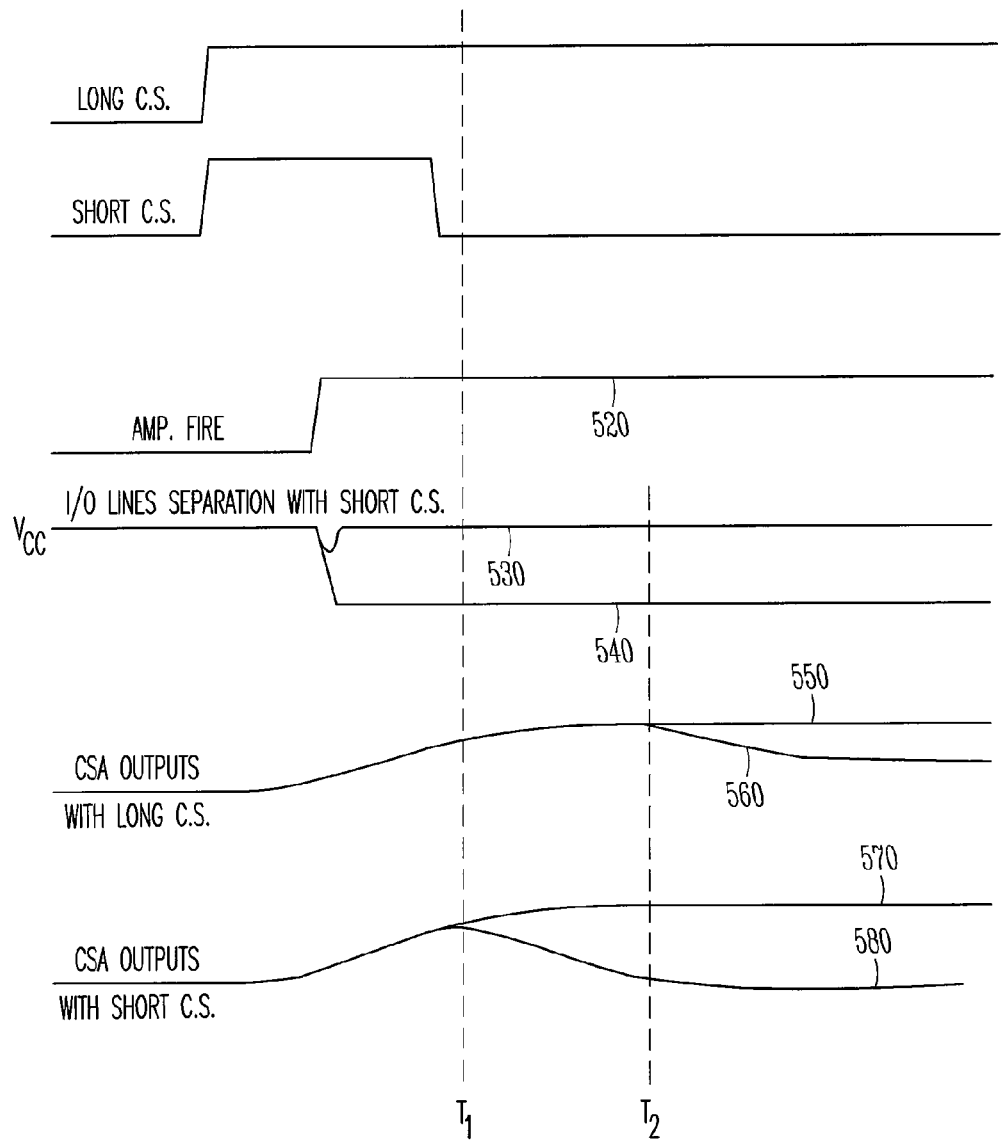
FIG. 5 illustrates waveform diagrams, in example embodiments, of various signals present in the schematic of FIG. 2.

Application of short CS pulses may not be plausible in the conventional voltage sensing and current propagating methods, because the separation between the I/O and I/O* lines may not be sufficient to prevent data disruption at the CSA 250, due to noise on the lines. However, using long CS pulses may not be desirable, as it may cause the disruption of the digit lines and may also prolong the data access time (see FIG. 5, CSA output signals 550 and 560, for long CS pulse, and compare with signal 570 and 580, for short CS pulse). Embodiments of the voltage amplifier assisted data sensing and propagation method make use of short CS pulses plausible, as demonstrated in the following discussion.

Returning to FIG. 2, in an example embodiment, the AMP FIRE line may be turned high (see signal 520 in FIG. 5) sometime after applying the CS pulse. Before turning the AMP FIRE line high, the coupling transistors 212 and 214 are in a conductive state, thereby, connecting the gates of P-transistor 220 and N-transistor 224 to the DL line, and the gates of P-transistor 222 and N-transistor 226 to the DL* line. That is to say, the gate of the N-transistor 224 is connected to a slightly higher voltage than the gate of the N-transistor 226. Right after the AMP FIRE line is turned high, the coupling transistor 230 turns into a conductive state, connecting sources of the N-transistors 224 and 226 to ground. At this time, the coupling transistors 212 and 214 are in an OFF state, thereby, isolating the voltage amplifier 210 from the digit lines DL and DL*, and enabling the latch function of the amplifier 210 to force the I/O line (e.g., coupling line 232) and the I/O* line (e.g., coupling line 234) to $V_{CC}$ and ground, respectively. (See signals 530 and 540 of FIG. 5).

The differential voltage developed between coupling lines 232 and 234 may then be converted to a differential current signal by the source followers formed by the transistors 244 and 246, once the enabling transistor 242 is turned ON by a high level of ENABLE line (EN). In an example embodiment, the different current signal developed between the lines 252 and 254 may be transmitted to the current sense amplifier 250, which may be positioned off the memory array 110 on the periphery area 130 near the I/O pads of the memory device 100.

Figure 6:
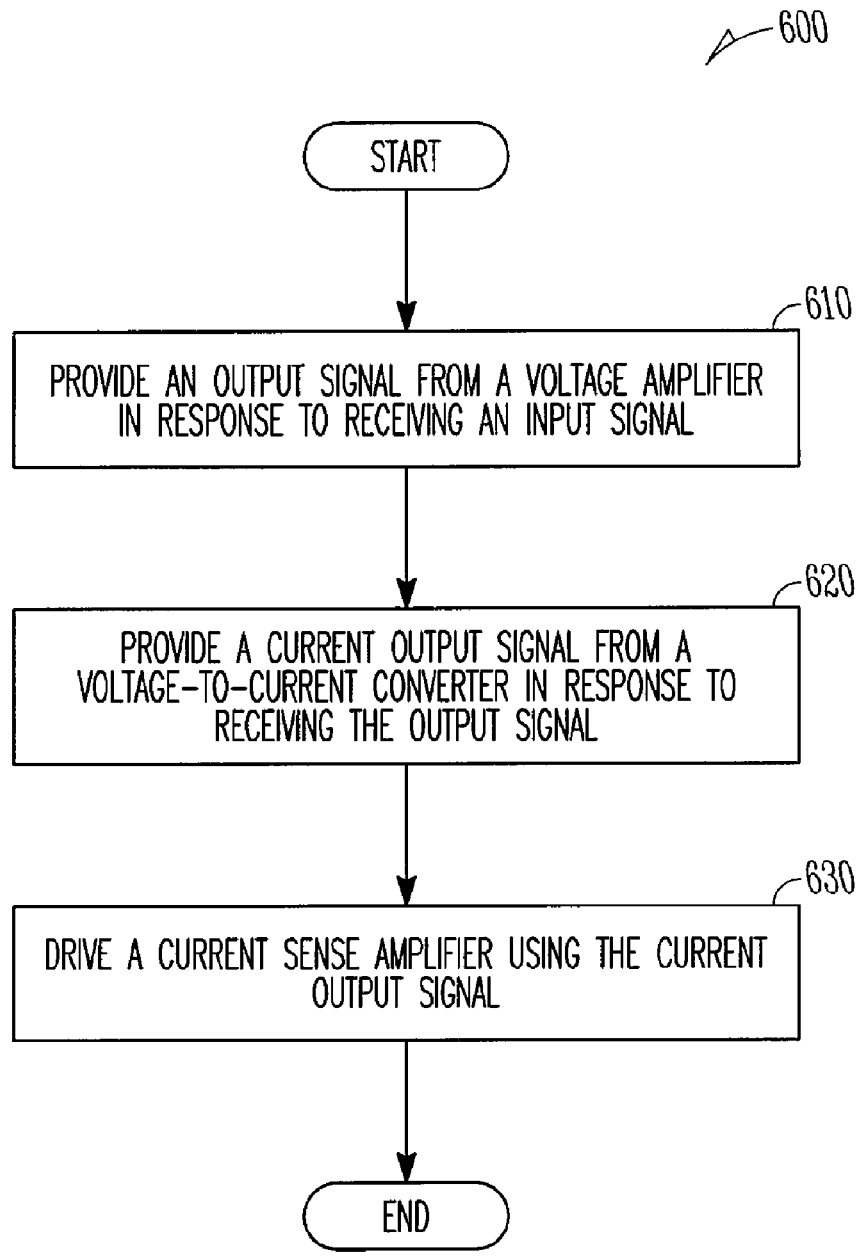
FIG. 6 is a high level flow diagram illustrating an example embodiment of a method for current mode data sensing and propagation by using voltage amplifier.

FIG. 6 is a high-level flow diagram illustrating an example embodiment of a method 600 for voltage amplifier assistant current mode data sensing and propagation. The method 600 starts at operation 610, where an output signal may be provided by the voltage amplifier 210 in response to receiving an input signal. In example embodiment, the input signal may include a pair of complimentary input signals received from I/O lines 202 and 204. The output signals may also include a pair of complimentary output signals provided at coupling lines 232 and 234. At operation 620, the voltage-to-current converter 240 may be used to provide current output signal in response to receiving the output signal from the voltage amplifier 210.

The current sense amplifier 250 may be driven, at operation 630, using the current output signal from the voltage-to-current converter 240. In an example embodiment, the voltage amplifier 210 and the voltage-to-current converter 240 may be part of the memory array 110. Whereas, the current sense amplifier 250 may be rendered in the periphery, near an output pad of the memory device. In this example embodiment, the current output signal from the voltage-to-current converter 240 may be transmitted through the lines 252 and 254 to the current sense amplifier 250.

Figure 7:
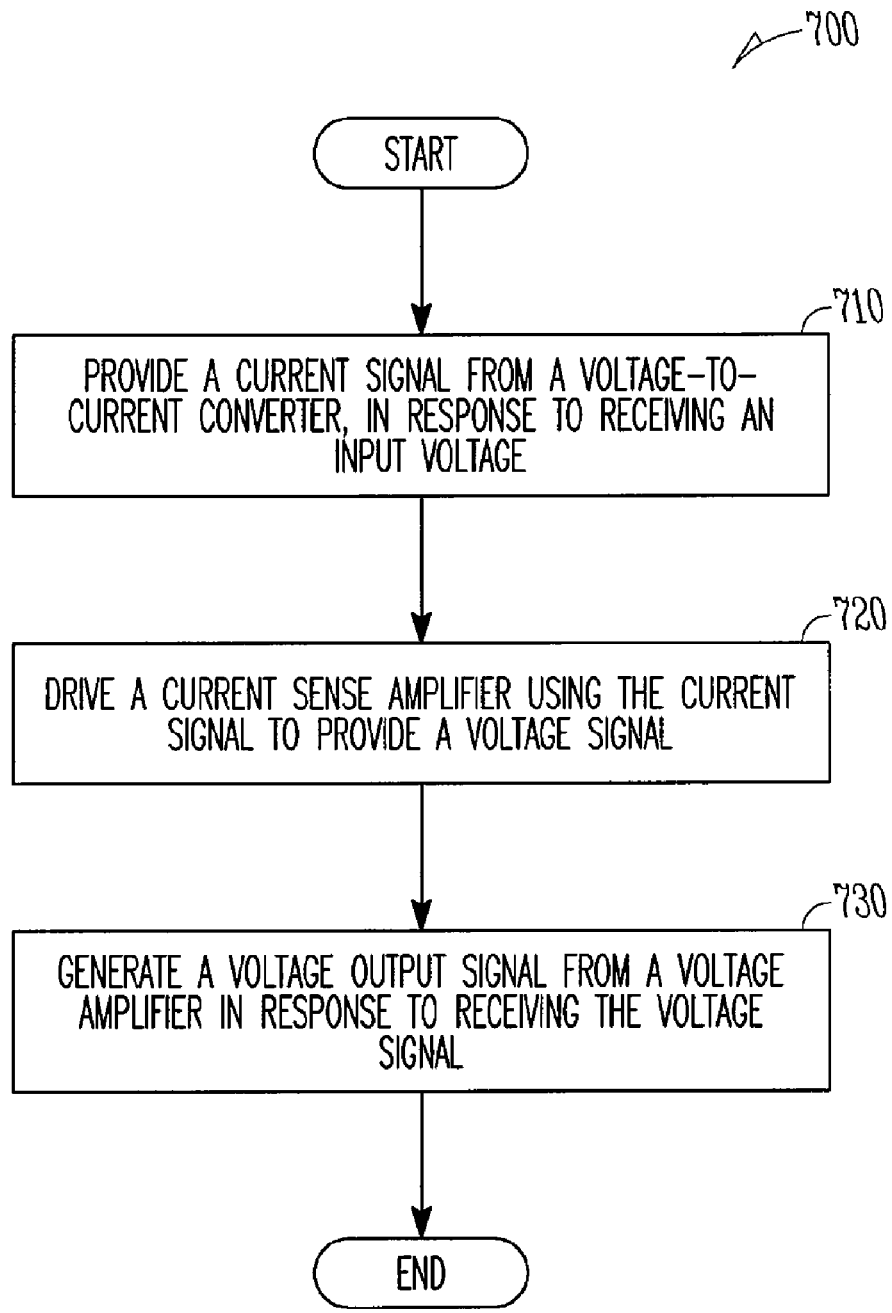
FIG. 7 is a high level flow diagram illustrating another example embodiment of a method for current mode data sensing and propagation by using voltage amplifier.
Figure 8:
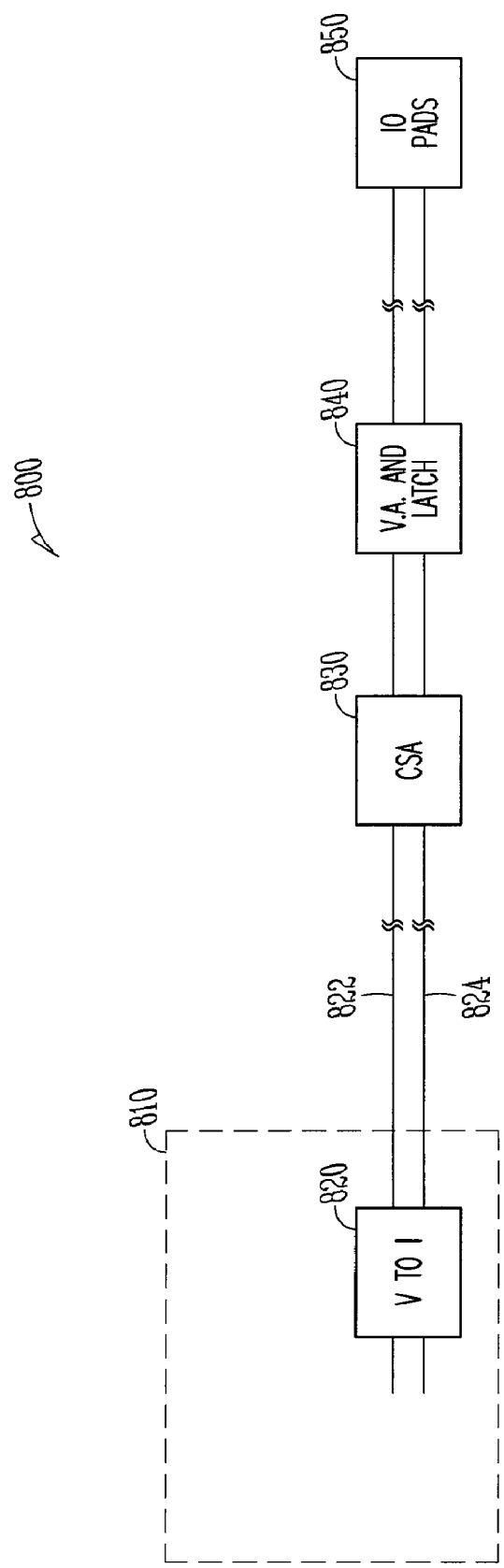
FIG. 8 is a high-level diagram illustrating an example embodiment of a voltage-amplifier assisted current mode data sensing and propagation method.

FIG. 7 is a high-level flow diagram illustrating an example embodiment of a method 700 for voltage amplifier assistant current mode data sensing and propagation. The method 700 may start at operation 710 where, as shown in FIG. 8, current signal from voltage-to-current converter 820 may be provided in response to receiving an input voltage. According to an example embodiment, the input voltage may include the voltage difference between the digit lines 122 and 124 of FIG. 1.

At operation 720, current sense amplifier 830 may be driven by the current signal provided by the voltage-to-current converter 820 to provide a voltage signal. At operation 730, the voltage signal from the current sense amplifier may be amplified by voltage amplifier 840 to provide the voltage output signal. According to an example embodiment, the current sense amplifier 830 and the voltage amplifier 840 may be positioned between the memory array 810 and the I/O paths 850. In an example embodiment, the voltage amplifier 840 may include latch function capabilities.

Figure 9:
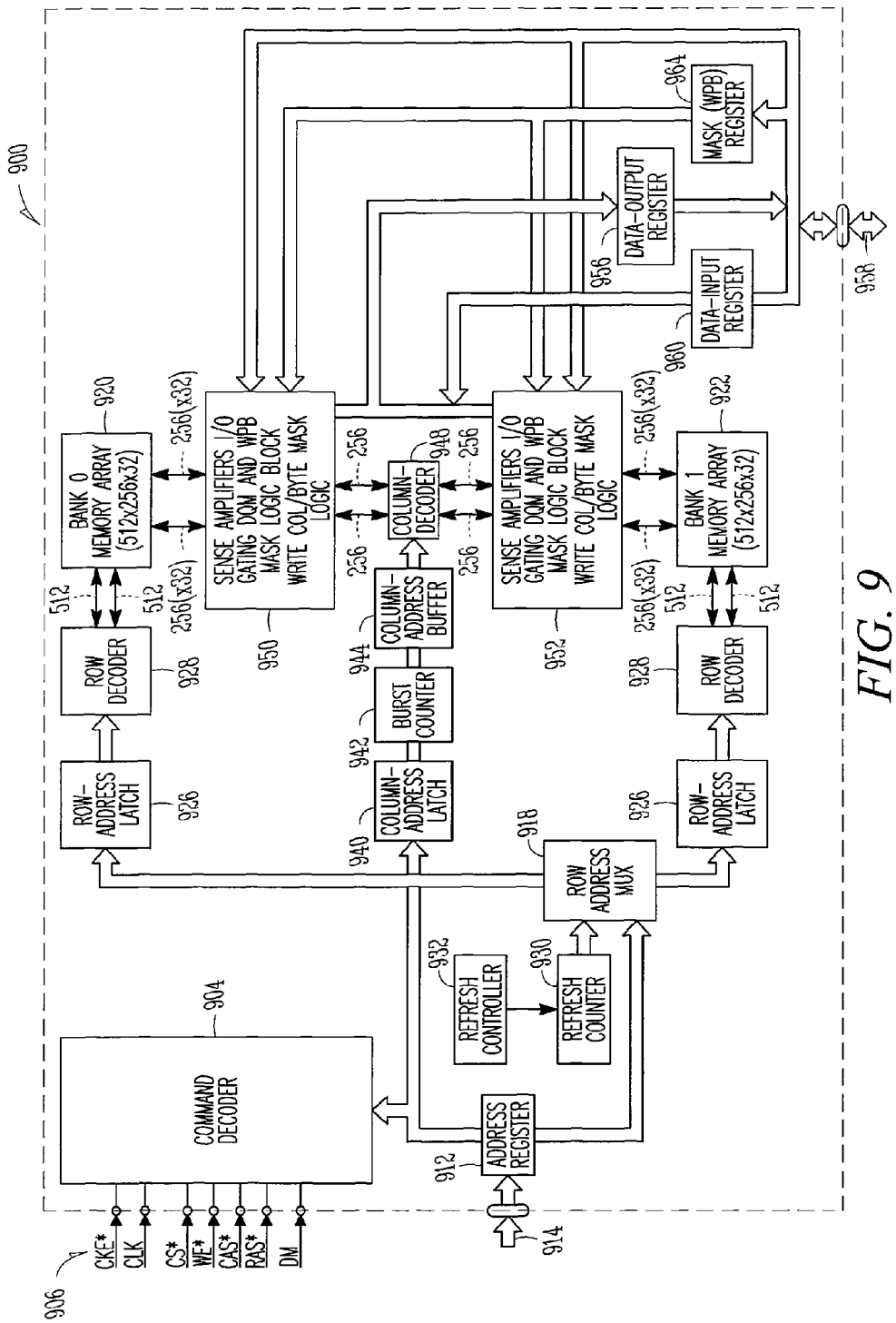
FIG. 9 is a block diagram illustrating an example embodiment of a memory device using voltage amplifier assisted current mode data sensing and propagation.

FIG. 9 is a block diagram illustrating in an example embodiment a synchronous dynamic random access memory (SDRAM) 900 device using the current mode data sensing and propagation by using voltage amplifier of FIG. 2 or some other embodiment discussed above. The voltage amplifier assisted current mode data sensing and propagation of FIG. 2 or other embodiments can also be used in other DRAM devices and other memory devices, such as SRAM devices, FLASH memory devices, etc.

The operation of the SDRAM 900 is controlled by a command decoder 904 responsive to high-level command signals received on a control bus 906. These high level command signals, which are typically generated by a memory controller (not shown in FIG. 9), are a clock enable signal CKE*, a clock signal CLK, a chip select signal CS*, a write enable signal WE*, a row address strobe signal RAS*, a column address strobe signal CAS*, and a data mask signal DM, in which the "*" designates the signal as active low.

The command decoder 904 may generate a sequence of command signals responsive to the high-level command signals to carry out the function (e.g., a read or a write) designated by each of the high-level command signals. These command signals, and the manner in which they accomplish their respective functions, are conventional. Therefore, in the interest of brevity, a further explanation of these command signals will be omitted.

The SDRAM 900 includes an address register 912 that receives row addresses and column addresses through an address bus 914. The address bus 914 is generally coupled to a memory controller (not shown in FIG. 9). A row address is generally first received by the address register 912 and applied to a row address multiplexer 918. The row address multiplexer 918 couples the row address to a number of components associated with either of two memory banks 920, 922 depending upon the state of a bank address bit forming part of the row address. Associated with each of the memory arrays 920, 922 is a respective row address latch 926, which stores the row address, and a row decoder 928, which decodes the row address and applies corresponding signals to one of the arrays 920 or 922. The row address multiplexer 918 also couples row addresses to the row address latches 926 for the purpose of refreshing the memory cells in the arrays 920, 922. The row addresses are generated for refresh purposes by a refresh counter 930, which is controlled by a refresh controller 932. The refresh controller 932 is, in turn, controlled by the command decoder 904.

After the row address has been applied to the address register 912 and stored in one of the row address latches 926, a column address is applied to the address register 912. The address register 912 couples the column address to a column address latch 940. Depending on the operating mode of the SDRAM 900, the column address is either coupled to the burst counter 942, which applies a sequence of column addresses to the column address buffer 944, starting at the column address output by the address register 912, or through a burst counter 942 to a column address buffer 944. In either case, the column address buffer 944 applies a column address to a column decoder 948.

Data to be read from one of the arrays 920, 922 is coupled to column circuitry 950, 952 (i.e., sense amplifiers, I/O gating, Dynamic Queue Manager (DQM) & Wide-Pulse Blanking (WPB) mask logic, block write col./byte mask logic) for one of the arrays 920, 922, respectively. The column circuitry 950, 952 may include, for each column of memory cells in the arrays 920, 922, and the sense amplifier 330 of FIG. 3 or a sense amplifier according to some other embodiment. The data bits developed by the sense amplifier 330 are then coupled to a data output register 956. Data to be written to one of the arrays 920, 922 are coupled from the data bus 958 through a data input register 960. The write data are coupled to the column circuitry 950, 952, where they are transferred to one of the arrays 920, 922, respectively. A mask register 964 responds to a data mask DM signal to selectively alter the flow of data into and out of the column circuitry 950, 952, such as by selectively masking data to be read from the arrays 920, 922.

Figure 10:
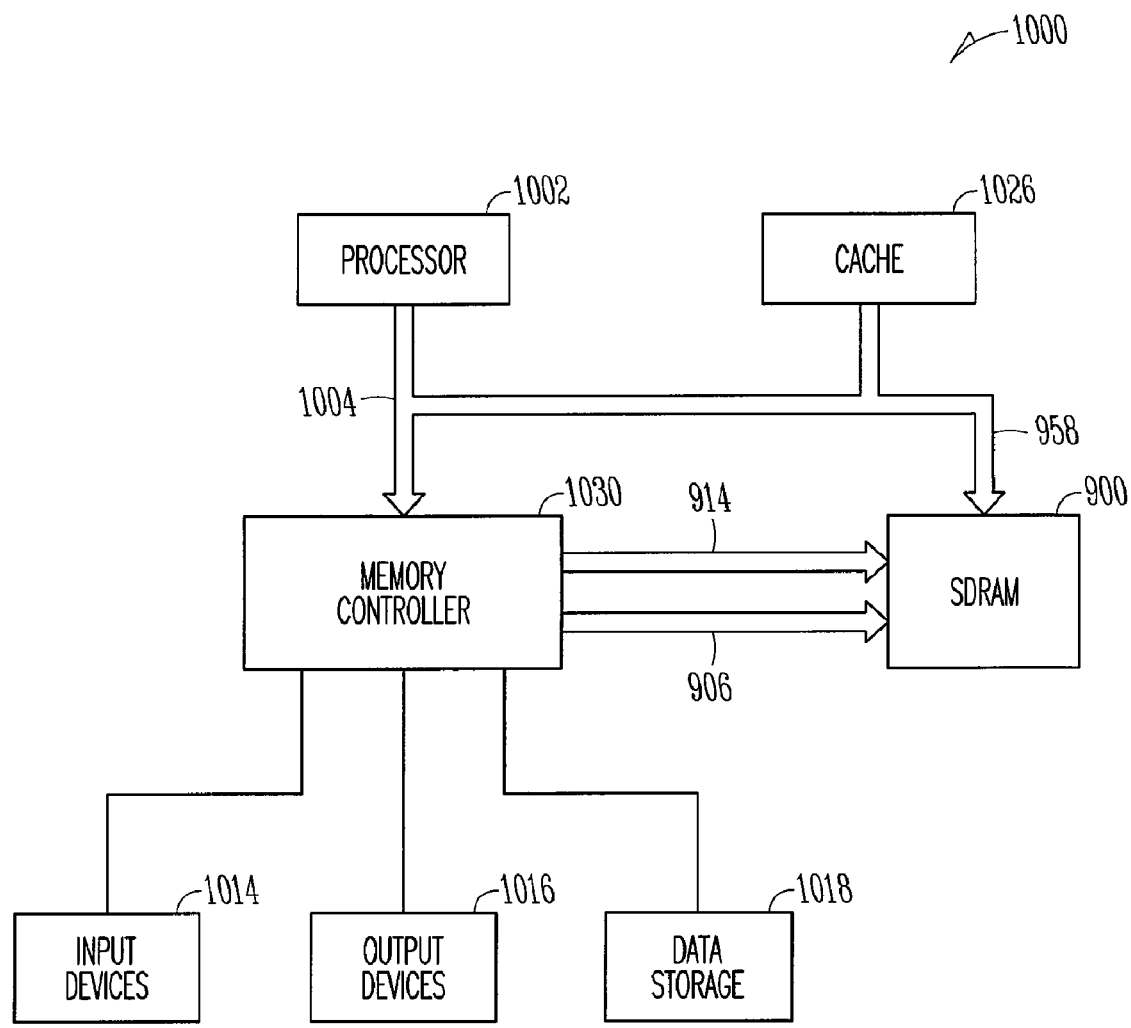
FIG. 10 is a block diagram of a computer system using the memory device of FIG. 9.

FIG. 10 shows an embodiment of a computer system 1000 that may use the SDRAM 900 or some other memory device that uses the current mode data sensing and propagation by using voltage amplifier of FIG. 2 or some other example embodiment. The computer system 1000 may include a processor 1002 for performing various computing functions, such as executing specific software to perform specific calculations or tasks. The processor 1002 may include a processor bus 1004 that normally includes an address bus, a control bus, and a data bus. In addition, the computer system 1000 includes one or more input devices 1014, such as a keyboard or a mouse, coupled to the processor 1002 to allow an operator to interface with the computer system 1000.

Typically, the computer system 1000 also includes one or more output devices 1016 coupled to the memory controller 1030; such output devices are typically a printer or a video terminal. One or more data storage devices 1018 are also typically coupled to the memory controller 1030 to store data or retrieve data from external storage media (not shown). Examples of typical storage devices 1018 may include hard and floppy disks, tape cassettes, and compact disk read-only memories (CD-ROMs). The processor 1002 is also typically coupled to a cache memory 1026, which may usually be a SRAM and to the SDRAM 900 through a memory controller 1030. The memory controller 1030 may include an address bus 914 (FIG. 10) to couple row addresses and column addresses to the DRAM 900. The memory controller 1030 also includes a control bus that couples command signals to a control bus 906 of the SDRAM 900. The external data bus 958 of the SDRAM 900 is coupled to the data bus of the processor 1002, either directly or through the memory controller 1030.

A method and a circuit for current mode data sensing and propagation by using voltage amplifier have been described. Although the present embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
    providing an output voltage signal from a flip-flop amplifier in response to the flip-flop amplifier receiving an input voltage signal;
    providing a current output signal from a voltage-to-current converter in response the voltage-to-current converter receiving the output voltage signal;
    driving a current sense amplifier using the current output signal; and
    latching the output voltage signal using the flip-flop amplifier and isolating the flip-flop amplifier from the input voltage signal substantially concurrent with latching and/or after latching.

2. The method of claim 1, wherein the input voltage signal includes a pair of complementary input voltage signals and the output voltage signal includes a pair of complementary output voltage signals.

3. The method of claim 1, wherein the current output signal includes a pair of complementary current signals.

4. The method of claim 2, wherein the pair of complementary input voltage signals is provided from differential digit lines associated with a memory cell.

5. The method of claim 1, wherein receiving the input voltage signal includes receiving the input voltage signal from a memory cell.

6. The method of claim 1, further comprising:
    using a column select pulse generated by a column select transistor coupled to the current sense amplifier to select a column of a memory device for access.

7. The method of claim 1, further comprising:
    transmitting the current output signal to the current sense amplifier to provide an output device signal to an output pad of a memory device.

8. The method of claim 5, wherein receiving the input voltage signal includes receiving the input voltage signal at a node between the memory cell and a position adjacent to an output pad of a memory device.

9. An apparatus comprising:
    a voltage amplifier configured to receive an input voltage signal and to operatively provide an output voltage signal in response thereto;
    a voltage-to-current converter arranged to receive the output voltage signal and to operatively generate a current output signal based on the output voltage signal;
    a current sense amplifier responsive to the current output signal; and
    a control element placed to isolate the voltage amplifier from the input voltage signal, wherein the control element is to isolate the voltage amplifier substantially concurrent with a latch operation and/or after the latch operation.

10. The apparatus of claim 9, wherein the output voltage signal includes a pair of complementary output signals.

11. The apparatus of claim 9, wherein the output voltage signal includes a differential voltage signal and the current output signal includes a differential current signal.

12. The apparatus of claim 9, wherein the voltage amplifier is coupled to a memory cell.

13. The apparatus of claim 9, wherein the voltage-to-current converter is configured to transmit the current output signal to the current sense amplifier, and wherein the current sense amplifier is coupled to an output pad of a memory device.

14. The apparatus of claim 9, wherein the voltage amplifier is configured to receive the input voltage signal at a node between a memory cell and an output pad of a memory device.

15. The apparatus of claim 9, wherein the voltage amplifier includes a cross-coupled voltage amplifier capable of performing a latch operation.

16. The apparatus of claim 9, wherein the control element comprises a transistor.

17. An apparatus comprising:
    a voltage-to-current converter configured to receive a voltage input signal and transmit a current signal based on the voltage input signal;
    a current sense amplifier configured to receive the current signal and to operatively provide a voltage signal in response thereto;
    a voltage amplifier configured to receive the voltage signal and to provide a voltage output signal; and
    a control transistor placed to isolate the voltage amplifier from the voltage input signal, wherein the control transistor is to isolate the voltage amplifier substantially concurrent with a latch operation and/or after the latch operation.

18. The apparatus of claim 17, wherein the voltage-to-current converter is configured to receive the voltage input signal from an amplifier, and wherein the voltage amplifier is configured to receive an input voltage from a memory cell.

19. The apparatus of claim 18, wherein the voltage-to-current converter is configured to transmit the current signal to the current sense amplifier positioned between the memory cell and an output pad of a memory device.

20. A memory device comprising:
    a voltage amplifier configured to receive an input signal from a memory cell and to operatively provide an output signal;
    a voltage-to-current converter configured to receive the output signal and operatively generate a current output signal based on the output signal;
    a current sense amplifier configured to provide an output voltage signal, in response to receiving the current output signal, the current sense amplifier to transmit the output voltage to an output pad coupled to an output terminal of the memory device; and an isolating means placed to isolate the voltage amplifier from the input signal, wherein the isolating means is to isolate the voltage amplifier substantially concurrent with a latch operation and/or after the latch operation.

21. The memory device of claim 20, wherein the voltage amplifier comprises a flip-flop amplifier configured to receive the input signal at a node between the memory cell and the output pad.

* * * * *

UNITED STATES PATENT AND TRADEMARK OFFICE
CERTIFICATE OF CORRECTION

| | | |
|---|---|---|
| PATENT NO. | : 8,014,220 B2 | Page 1 of 1 |
| APPLICATION NO. | : 12/889104 | |
| DATED | : September 6, 2011 | |
| INVENTOR(S) | : Morgan | |

It is certified that error appears in the above-identified patent and that said Letters Patent is hereby corrected as shown below:

In column 7, line 36, in Claim 1, after "response" insert -- to --.

Signed and Sealed this
Sixth Day of December, 2011

David J. Kappos
*Director of the United States Patent and Trademark Office*